United States Patent [19]
Tsunai

[11] Patent Number: 5,585,797
[45] Date of Patent: Dec. 17, 1996

[54] SIGNAL PROCESSING DEVICE HAVING A FUNCTION OF CONVERTING AN ANALOG SIGNAL INTO A DIGITAL SIGNAL

[75] Inventor: Shiro Tsunai, Tokyo, Japan

[73] Assignee: NEC Corporation, Tokyo, Japan

[21] Appl. No.: 240,465

[22] Filed: May 10, 1994

[30]  Foreign Application Priority Data

May 10, 1993  [JP]  Japan ................................. 5-107802

[51] Int. Cl.⁶ .................................................. H01L 29/78
[52] U.S. Cl. .......................... 341/172; 341/133; 341/136
[58] Field of Search ................................. 341/172, 133, 341/136, 161, 162

[56]  References Cited

U.S. PATENT DOCUMENTS 4,064,515  12/1977  Mashimo ................... 354/123
4,631,484  12/1986  Malka ........................ 328/63
5,103,278   4/1992  Miwada ..................... 357/24

FOREIGN PATENT DOCUMENTS

61-184978  8/1986  Japan .

Primary Examiner—Jeffrey A. Gaffin
Assistant Examiner—Peguy JeanPierre
Attorney, Agent, or Firm—Young & Thompson

[57]  ABSTRACT

A signal processing device comprises a charge transfer device and a driving circuit, which includes a reference signal generating circuit for generating a reference signal, a transfer clock generating circuit receiving the reference signal for generating a transfer clock to a charge transfer section of the charge transfer device, a digital counter of N bits receiving and counting the reference signal, a D/A converter receiving the output of said counter for converting it into an analog voltage signal, which is applied to a final transfer gate of the charge transfer device, and a latch for latching an output of the counter when an output of a electric charge detection circuit of the charge transfer device reaches a predetermined level, whereby the latch outputs a digital signal of N bits corresponding to a signal electric charge outputted from the charge transfer section.

6 Claims, 12 Drawing Sheets

| DISCRIMINATING CONDITION OF COMPARATOR GROUP 36 | OUTPUT OF COMPARATOR GROUP 36 | | | OUTPUT OF EMCODING CIRCUIT 44 | | OUTPUT OF ELECTRIC CHARGE ADDER 46 |
|---|---|---|---|---|---|---|
| | $C_1$ | $C_2$ | $C_3$ | $D_1$ | $D_2$ | |
| $V_S > \frac{3}{4} V_R$ | 1 | 1 | 1 | 1 | 1 | $V_S$ |
| $\frac{3}{4} V_R > V_S > \frac{1}{2} V_R$ | 0 | 1 | 1 | 1 | 0 | $V_S + \frac{1}{4} V_R$ |
| $\frac{1}{2} V_R > V_S > \frac{1}{4} V_R$ | 0 | 0 | 1 | 0 | 1 | $V_S + \frac{1}{2} V_R$ |
| $\frac{1}{4} V_R > V_S$ | 0 | 0 | 0 | 0 | 0 | $V_S + \frac{3}{4} V_R$ |

FIGURE 3B

| OUTPUT OF ELECTRIC CHARGE ADDER 46 | DISCRIMINATING CONDITION OF COMPARATOR GROUP 51 | OUTPUT OF COMPARATOR GROUP 51 | | | OUTPUT OF EMCODING CIRCUIT 46 | |
|---|---|---|---|---|---|---|
| | | $C_4$ | $C_5$ | $C_6$ | $D_3$ | $D_4$ |
| $V_S$ | $V_S > \frac{15}{16} V_R$ | 1 | 1 | 1 | 1 | 1 |
| | $\frac{15}{16} V_R > V_S > \frac{14}{16} V_R$ | 0 | 1 | 1 | 1 | 0 |
| | $\frac{14}{16} V_R > V_S > \frac{13}{16} V_R$ | 0 | 0 | 1 | 0 | 1 |
| | $\frac{13}{16} V_R > V_S > \frac{12}{16} V_R$ | 0 | 0 | 0 | 0 | 0 |
| $V_S + \frac{1}{4} V_R$ | $\frac{12}{16} V_R > V_S > \frac{11}{16} V_R$ | 1 | 1 | 1 | 1 | 1 |
| | $\frac{11}{16} V_R > V_S > \frac{10}{16} V_R$ | 0 | 1 | 1 | 1 | 0 |
| | $\frac{10}{16} V_R > V_S > \frac{9}{16} V_R$ | 0 | 0 | 1 | 0 | 1 |
| | $\frac{9}{16} V_R > V_S > \frac{8}{16} V_R$ | 0 | 0 | 0 | 0 | 0 |
| $V_S + \frac{1}{2} V_R$ | $\frac{8}{16} V_R > V_S > \frac{7}{16} V_R$ | 1 | 1 | 1 | 1 | 1 |
| | $\frac{7}{16} V_R > V_S > \frac{6}{16} V_R$ | 0 | 1 | 1 | 1 | 0 |
| | $\frac{6}{16} V_R > V_S > \frac{5}{16} V_R$ | 0 | 0 | 1 | 0 | 1 |
| | $\frac{5}{16} V_R > V_S > \frac{4}{16} V_R$ | 0 | 0 | 0 | 0 | 0 |
| $V_S + \frac{3}{4} V_R$ | $\frac{4}{16} V_R > V_S > \frac{3}{16} V_R$ | 1 | 1 | 1 | 1 | 1 |
| | $\frac{3}{16} V_R > V_S > \frac{2}{16} V_R$ | 0 | 1 | 1 | 1 | 0 |
| | $\frac{2}{16} V_R > V_S > \frac{1}{16} V_R$ | 0 | 0 | 1 | 0 | 1 |
| | $\frac{1}{16} V_R > V_S$ | 0 | 0 | 0 | 0 | 0 |

SIGNAL PROCESSING DEVICE HAVING A FUNCTION OF CONVERTING AN ANALOG SIGNAL INTO A DIGITAL SIGNAL

BACKGROUND OF THE INVENTION

1. Field of the invention

The present invention relates to a signal processing device, and more specifically to a signal processing device for converting into a digital signal a signal charge amount outputted from an electric charge transfer device typified particularly by a charge transfer device type image sensor and a charge transfer device type delay line.

2. Description of Related Art

Figure 1:
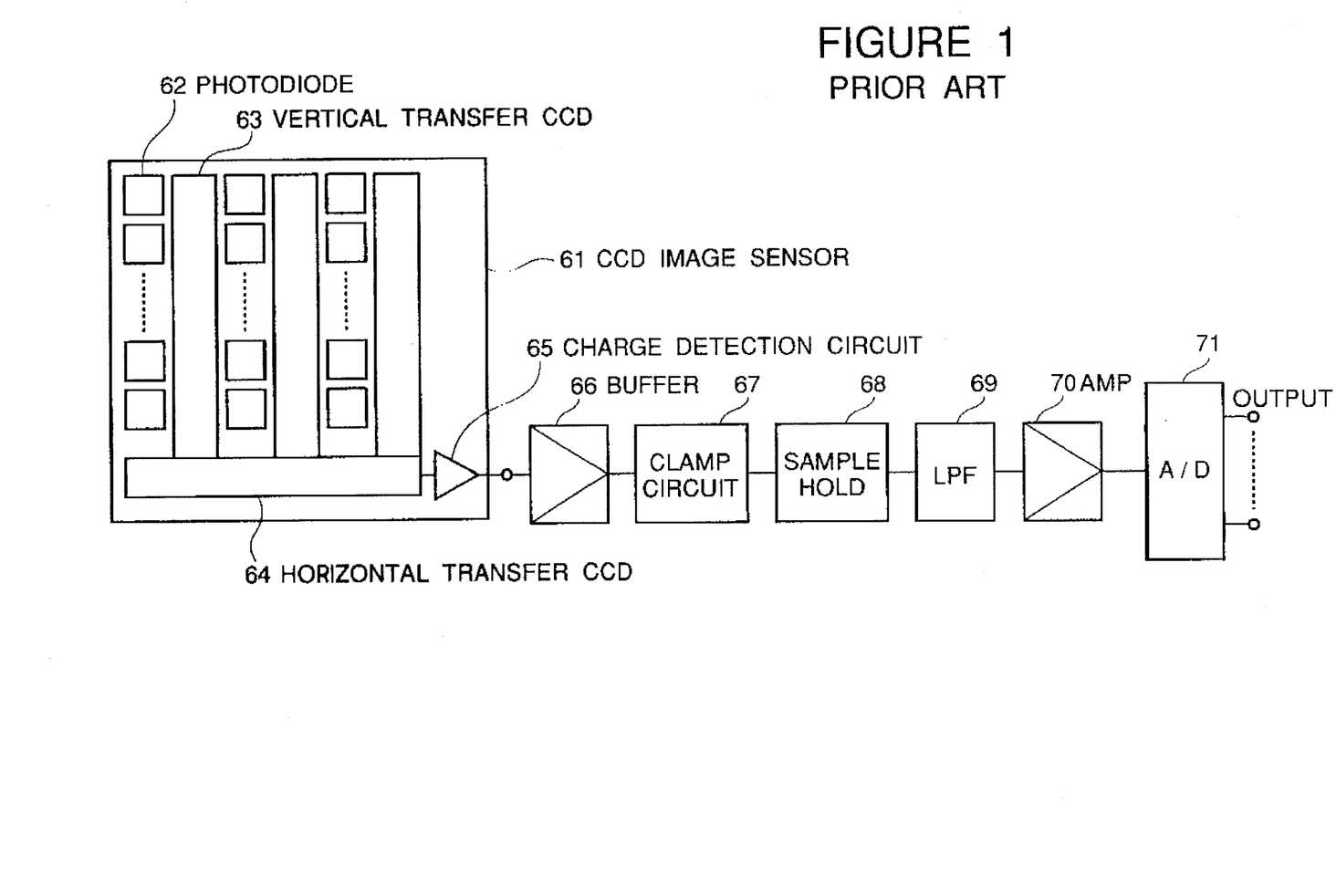
FIG. 1 is a block diagram of a conventional circuit for processing in the form of a digital signal an analog signal outputted from a charge transfer device type image sensor.

In the prior art, in the case of processing in the form of a digital signal an analog signal outputted from a charge transfer device type image sensor or a charge transfer device type delay line, for example, as shown in FIG. 1, an analog signal outputted from a charge transfer device type image sensor 61 is caused to pass through a buffer 66, a clamp circuit 67, a sample-hold circuit 68, a low pass filter 69, and an amplifier 70 for various signal processings, and thereafter, the analog signal is supplied an A/D converter (analog-to-digital converter) 71, so that a digital signal is obtained. This method has required a number of circuit elements, and the circuit designing and the signal processings for this method must use a complicated analog signal processing technique, which has become a hindrance in making the circuit designing easier.

For reference, as extremely simply depicted in FIG. 1, the charge transfer device type image sensor 61 is basically composed of a number of photosensor cells such as photodiodes 62 arranged in the form of a matrix having a plurality of rows and a plurality of columns, a plurality of vertical charge transfer devices each located along a corresponding column of photodiodes so as to receive an electric charge from all the photodiodes of the corresponding column in parallel and to vertically transfer the received electric charges, a horizontal charge transfer device located along an output end of all the vertical charge transfer devices so as to receive an electric charge from all the vertical charge transfer devices in parallel and to horizontally transfer the received electric charge, and an electric charge detection circuit 65 having an input coupled to an output end of the horizontal charge transfer device. An output of the electric charge detection circuit 65 is connected to the buffer 66.

Japanese Patent Application Laid-open Publication No. JP-A-61-184978 has proposed a signal processing device which attempts to improve the above mentioned problems and includes a charge coupled device (abbreviated "CCD" hereinafter) as the charge transfer device The proposed signal processing device includes two two-bit A/D converters so that one of the two-bit A/D converters is used for the more significant two bits, and the other two-bit A/D converter is used for the least significant two bits, whereby a resolution of 4 bits per sample can be obtained in total.

Figure 2:
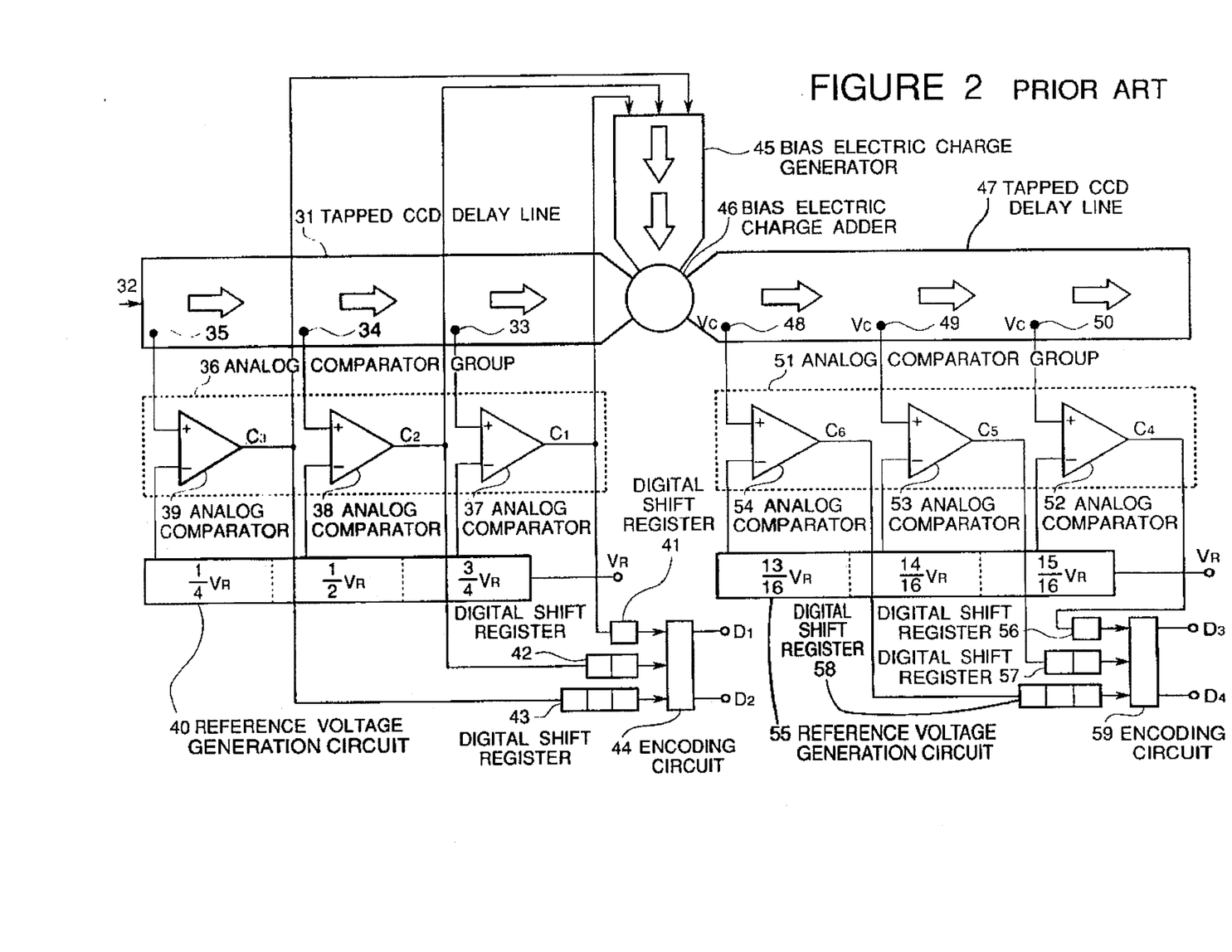
FIG. 2 is a block diagram illustrating the construction of the A/D converter disclosed in the prior art Japanese patent application laid-open publication.
Figure 3A:
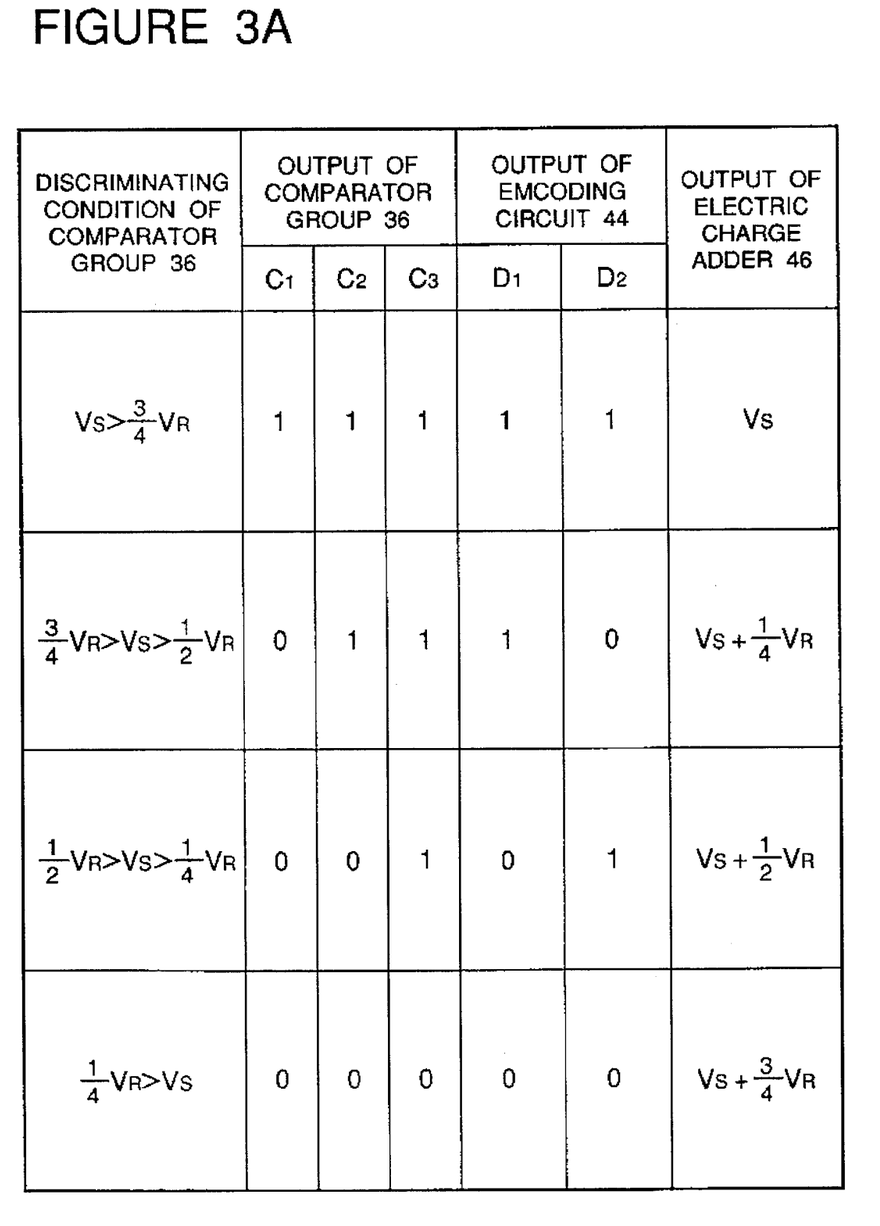
FIGS. 3A and 3B are tables illustrating an operation of the A/D converter shown in FIG. 2.
Figure 3B:
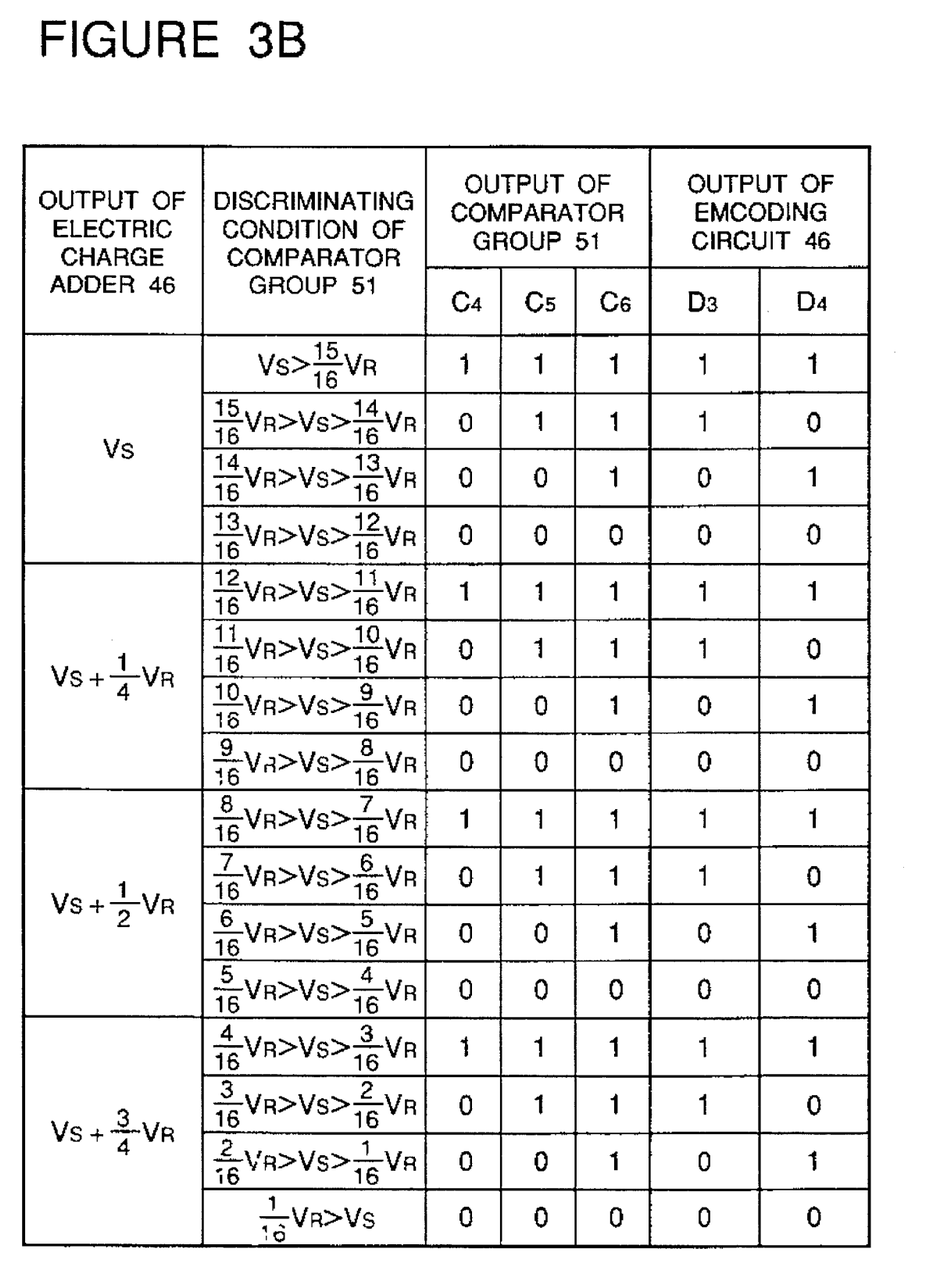

Referring to FIG. 2, there is shown a block diagram illustrating the construction of the A/D converter disclosed in the above referred Japanese patent application laid-open publication. FIGS. 3A and 3B are tables illustrating an operation of the shown A/D converter.

The shown A/D converter includes a tapped CCD delay line 31, which is coupled to an output of a CCD image sensor or delay line so as to receive a signal electric charge transferred in a transfer direction 32. The signal electric charge is transferred through the tapped CCD delay line 31. Simultaneously, at each time the signal electric charge is transferred one stage within the tapped CCD delay line 31, the magnitude of the signal electric charge is nondestructively detected, so that a signal voltage is applied from signal electric charge output terminals 33, 34 and 35 to a signal input terminal of analog comparators 39, 38 and 37 included in an analog comparator group 36. Assuming that a reference voltage is $V_R$, a reference voltage terminal of these analog comparators 37, 38 and 39 are supplied with $3V_R/4$, $V_R/2$, and $V_R/4$, respectively, which are generated in a reference voltage generation circuit 40.

Here, operation of the analog comparator 37 will be explained. If a signal voltage $V_S$ detected in the tapped CCD delay line 31 is larger than $3V_R/4$ ($V_S>3V_R/4$), the analog comparator 37 brings its output discrimination signal $C_1$ into a high level "1". If the relation of $V_S<3V_R/4$ holds, the discrimination signal $C_1$ is brought into a low level "0". The other analog comparators 38 and 39 operate similarly, except that the applied reference voltage is $V_R/2$ or $V_R/4$.

Accordingly, in the case of $V_S>3V_R/4$, all discrimination signals $C_1$, $C_2$ and $C_3$ outputted from the analog comparators 37, 38 and 39, respectively, become the high level "1". In the case of $3V_R/4>V_S>V_R/2$, the discrimination signals $C_2$ and $C_3$ become the high level "1". In the case of $V_R/2>V_S>V_R/4$, only the discrimination signal $C_3$ becomes the high level "1". In the case of $V_R/4>V_S$, all of the discrimination signals $C_1$, $C_2$ and $C_3$ become the low level "0".

The discrimination signals $C_1$, $C_2$ and $C_3$ outputted from the analog comparators 37, 38 and 39, are respectively supplied to digital shift registers 41, 42 and 43 having different delay times for compensating the fact that the detection for the same signal charge is delayed one clock by one clock from the terminal 33 to the terminal 34 and also from the terminal 34 to the terminal 35, as would be apparent from the operation of the tapped charge transfer device delay line 31. For this purpose, the digital shift registers 41, 42 and 43 are driven by a clock having the same frequency as that of a clock for driving the tapped charge transfer device delay line 31, and the delay times of the digital shift registers 41, 42 and 43 are selected to correspond to the delay time occurring in the tapped charge transfer device delay line 31.

The discrimination signals $C_1$, $C_2$ and $C_3$ thus adjusted to have concurrency by action of the digital shift registers 41, 42 and 43, are supplied to an encoder 44, where the discrimination signals $C_1$, $C_2$ and $C_3$ are converted to binary signals $D_1$ and $D_2$ of two bits as shown in FIG. 3A. Thus, with the above mentioned operation, the A/D conversion for obtaining two most significant bits can be realized.

Furthermore, the discrimination signals $C_1$, $C_2$ and $C_3$ are applied to a bias electric charge generator 45, which is configured to generate and add a bias electric charge corresponding to $V_R/4$ for each of the discrimination signals $C_1$, $C_2$ and $C_3$ when the discrimination signal is at the low level "0". Namely, as shown in FIG. 3B, when all of the discrimination signals $C_1$, $C_2$ and $C_3$ are at the high level "1", no bias electric charge is generated and added. When only the discrimination signal $C_1$ is at the low level "0", a bias electric charge corresponding to $V_R/4$ is generated, and added to the electric charge outputted from the tapped charge transfer device delay line 31, in a bias electric charge adder 46. If both of the discrimination signals $C_1$ and $C_2$ are at the low level "0", a bias electric charge corresponding to $V_R/2$ is generated and added in the bias electric charge adder 46. In the case that all of the discrimination signals $C_1$, $C_2$ and $C_3$ are at the low level "0", a bias electric charge corresponding to $3V_R/4$ is generated and added in the bias electric charge adder 46.

The signal electric thus added with the bias electric charge is supplied from the bias electric charge adder 46 to another tapped charge transfer device delay line 47 so as to be transferred through the tapped charge transfer device delay line 47. Similarly to the tapped charge transfer device delay line 31, the electric charge through the tapped charge transfer device delay line 47 is nondestructively detected at each one of the stage transfer operation, so that a synthetic signal voltage is applied from signal electric charge output terminals 48, 49 and 50 to a signal input terminal of analog comparators 54, 53 and 52 included in another analog comparator group 51. On the other hand, a reference voltage terminal of these analog comparators 52, 53 and 54 are supplied with $15V_R/16$, $14V_R/16$, and $13V_R/16$, respectively, which are generated in a reference voltage generation circuit 55.

Here, assuming that the synthetic signal voltage outputted from signal electric charge output terminals 48, 49 and 50 is expressed by $V_C$, in the case of $V_C>15V_R/16$, all discrimination signals $C_4$, $C_5$ and $C_6$ outputted front the analog comparators 52, 53 and 54, respectively, become the high level "1". In the case of $15V_R/16>V_S>14V_R/16$, the discrimination signals $C_5$ and $C_6$ become the high level "1". In the case of $14V_R/16>V_S>13V_R/16$, only the discrimination signal $C_6$ becomes the high level "1" In the case of $13V_R/16>V_S(>12V_R/16)$, all of the discrimination signals $C_4$, $C_5$ and $C_6$ become the low level "0".

Here, since the bias electric charge component included in the synthetic signal voltage $V_C$ is "0", $V_R/4$, $V_R/2$ or $3V_R/4$, the discriminating condition for the signal voltage $V_s$ can be sorted into 16 kinds as shown in FIG. 3B.

The discrimination signals $C_4$, $C_5$ and $C_6$ outputted from the analog comparators 52, 53 and 54, are respectively supplied to digital shift registers 56, 57 and 57 having different delay times for compensating differences in the delay time. The discrimination signals $C_4$, $C_5$ and $C_6$ thus adjusted to have concurrency by action of the digital shift registers 56, 57 and 57, are supplied to an encoder 59, in which the discrimination signals $C_4$, $C_5$ and $C_6$ are converted to binary signals $D_3$ and $D_4$ of two bits as shown in FIG. 3B. Thus, an A/D conversion section for obtaining two least significant bits can be constituted of the tapped charge transfer device delay line 47, the analog comparator group 51, the reference voltage generation circuit 55, the digital shift registers 56, 57 and 58, the encoder 59.

Accordingly, with combination of the two least significant bits $D_3$ and $D_4$ with the two most significant bits $D_1$ and $D_2$, an A/D converter having a resolution of 4 bits per sample can be acheived.

However, the above mentioned signal processing device for converting the analog signal to the digital signal had to include a number of nondestructive electric charge detection circuits and reference voltages in correspondence to the number of the electric charge amounts to be detected. In addition, for constituting the four-bit A/D converter, there are required six analog comparators, six digital shift registers, and six charge transfer delay line stages. Furthermore, since the digital output signals are synchronized to have concurrency in time by the digital shift registers, the circuit construction inevitably becomes complicated.

SUMMARY OF THE INVENTION

Accordingly, it is an object of the present invention to provide a signal processing device which has overcome the above mentioned defect of the conventional one.

Another object of the present invention is to provide a circuit which can give a digital signal corresponding to a signal electric charge, and which is remarkably simpler than the conventional circuit.

The above and other objects of the present invention are achieved in accordance with the present invention by a signal processing device comprising:

a charge transfer device including a charge transfer section composed of a plurality of transfer electrodes formed through a gate insulating film on a surface of a semiconductor substrate and arranged in the form of a column, a final transfer gate located adjacent to an output end of the charge transfer section, an output gate located adjacent to the final transfer gate, and an electric charge detection means located adjacent to the output gate; and a driving circuit including a reference signal generating circuit for generating a reference signal, a transfer clock generating circuit receiving the reference signal for generating a transfer clock to the charge transfer section, a digital counter of N bits receiving and counting the reference signal, a voltage generating means for generating a voltage starting to change in synchronism with the start of a counting operation of the counter, the voltage being applied to one of the final transfer gate and the output gate, and a latch for latching an output of the counter when an output of the electric charge detection means reaches a predetermined level, whereby the latch outputs a digital signal of N bits corresponding to a signal electric charge outputted from the charge transfer section.

In one embodiment, the voltage generating means includes a D/A converter receiving the output of the counter for converting, it into an analog voltage signal, which is applied to the final transfer gate.

In another embodiment the voltage generating means includes a saw tooth wave generating circuit for generating a saw tooth wave in response to an output signal of the transfer clock generating circuit and in synchronism with the reference signal, the saw tooth wave being applied to the final transfer gate.

Alternatively, the transfer clock is also applied to the final transfer gate, and the voltage generating means includes a saw tooth wave generating circuit for generating a saw tooth wave in response to an output signal of the transfer clock generating circuit and in synchronism with the reference signal, the saw tooth wave being applied to the output gate.

In addition, the electric charge detection means can be of a voltage detection type. In this case, the circuit further includes a voltage comparator having an inverted input connected to receive an output signal of the electric charge detection means and a non-inverted input connected to a reference voltage, an output of the voltage comparator being applied to a latch control input of the latch. However, the electric charge detection means can be of a current detection type.

The above and other objects, features and advantages of the present invention will be apparent from the following description of preferred embodiments of the invention with reference to the accompanying drawings.

DESCRIPTION OF THE PREFERRED EMBODIMENTS

Figure 4:
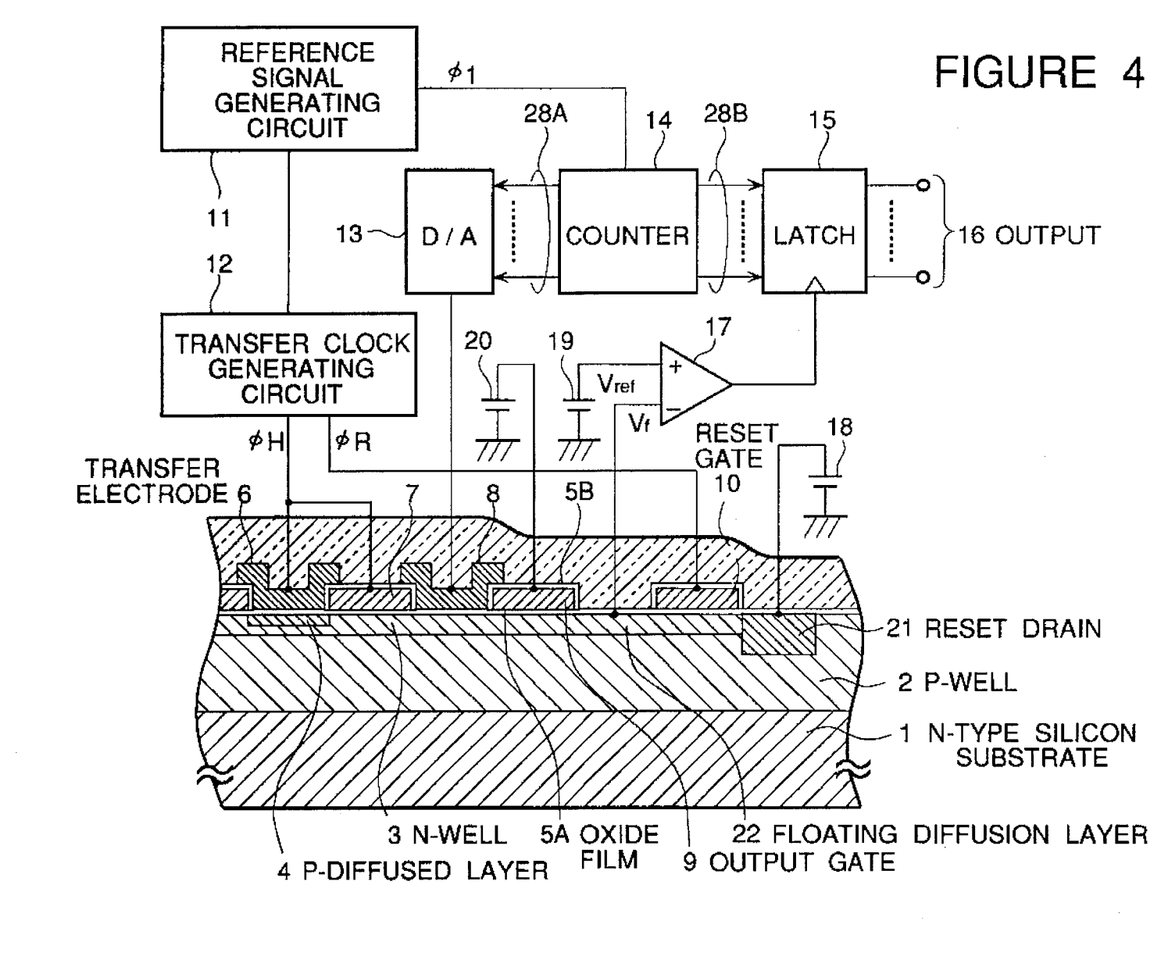
FIG. 4 is a block diagram illustrating a first embodiment of an A/D converting circuitry in accordance with the present invention.
Figure 5A:
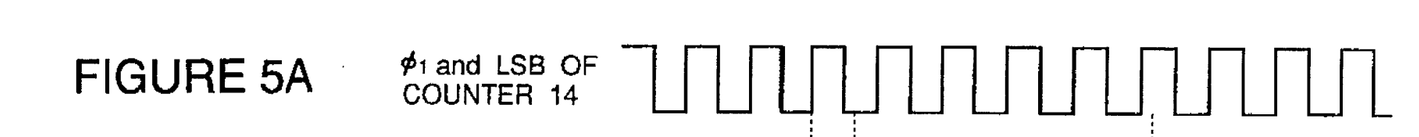
FIG. 5 is a timing chart illustrating an operation of the first embodiment shown in FIG. 4.
Figure 5B:
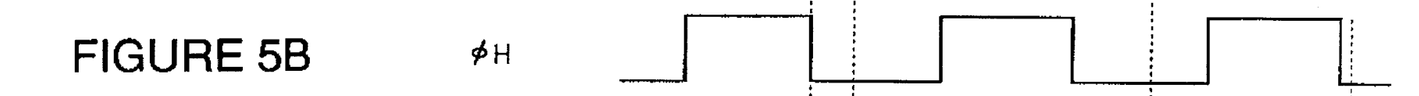
Figure 5C:
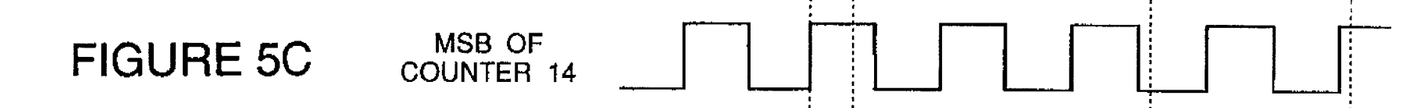
Figure 5D:
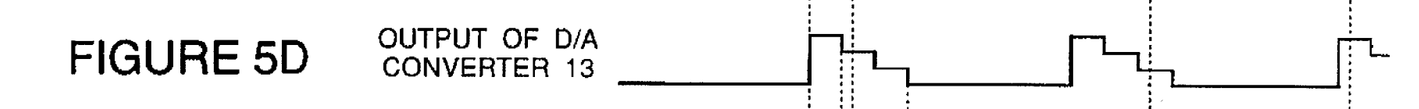
Figure 5E:
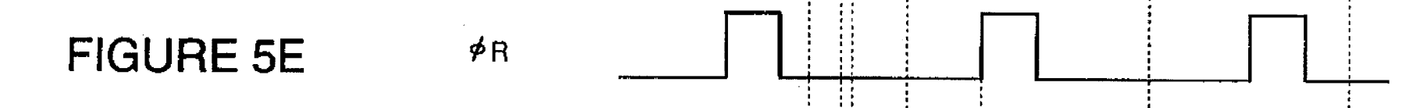
Figure 5F:
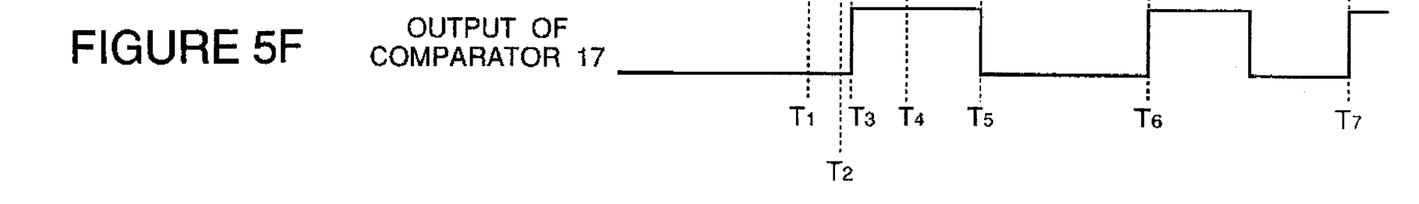
Figure 6A:
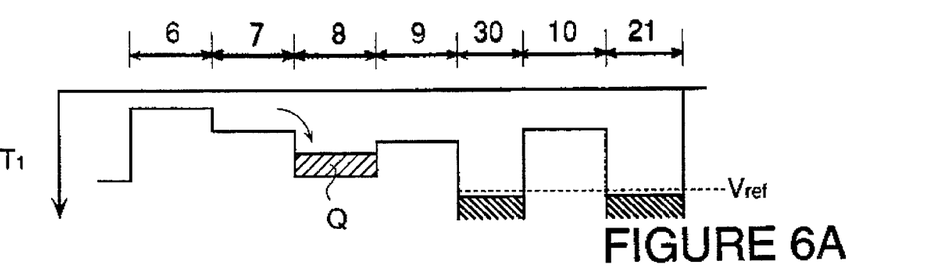
FIG. 6 is a potential diagram illustrating a charge transfer process in the first embodiment shown in FIG. 4.
Figure 6B:
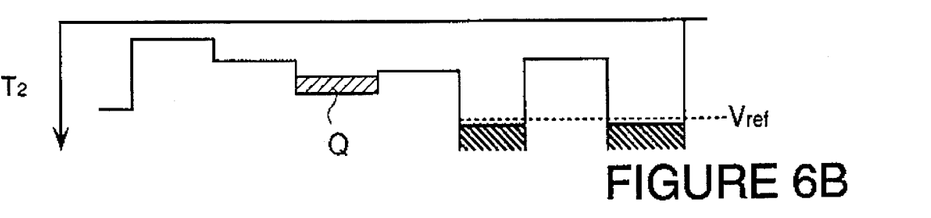
Figure 6C:
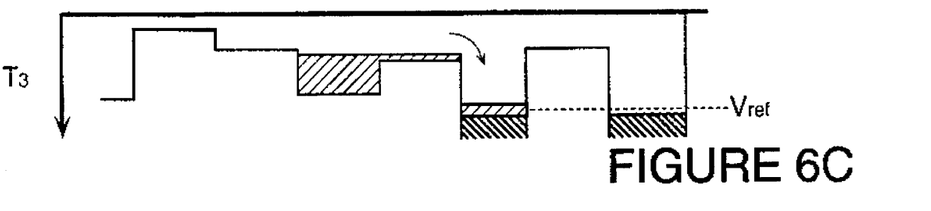
Figure 6D:
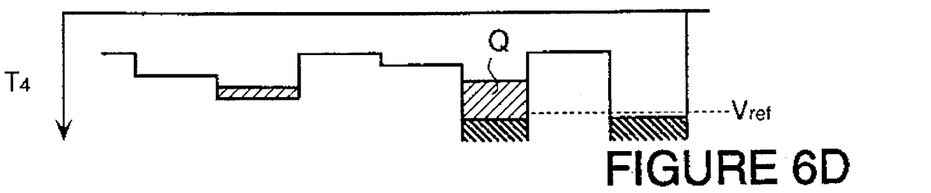
Figure 6E:
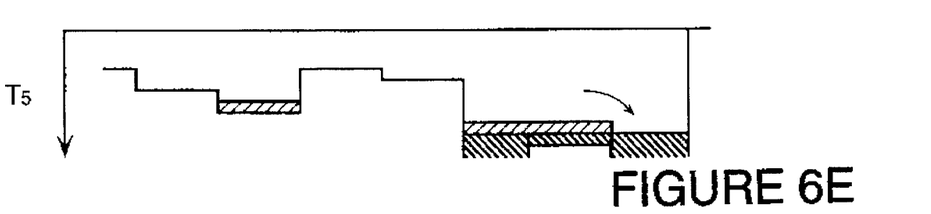

Referring to FIG. 4, there is shown a block diagram illustrating a first embodiment of an A/D converting circuitry in accordance with the present invention. FIG. 5 is a timing chart illustrating an operation of the first embodiment, and for illustrating a charge transfer process in the first embodiment, FIG. 6 shows a potential of a semiconductor substrate surface at various timings $T_1$, $T_2$, $T_3$, $T_4$, and $T_5$ in the timing chart of FIG. 5 when appropriate driving signals are applied to the corresponding electrodes in the first embodiment.

As shown in a partial diagrammatic sectional view of FIG. 4 showing an output part of the CCD structure, an N-type silicon substrate 1 has a P-well 2 formed at a surface thereof, and an N-well 3 is further foraged on a surface of the P-well 2. The N-well 3 is terminated by a reset drain 21 foraged in the P-well 2. A gate oxide film 5A is formed to cover the surface of the semiconductor substrate, and transfer electrodes 6 and 7, a final transfer gate electrode 8, an output gate electrode 9, and a reset gate electrode 10 are formed on the gate oxide film 5A in the named order toward to the reset drain 21, so that the reset gate electrode 10 is positioned adjacent to the reset drain 21. The transfer electrode 7, the output gate electrode 9 and the reset gate electrode 10 are covered with a silicon oxide film 5B. A portion of the N-well 3 between the output gate electrode 9 and the reset gate electrode 10 constitutes an electrically floating diffusion region 22, which is reset to the same potential as that of a reset drain voltage 18 connected to the reset drain 21 by applying a reset signal φR to the reset gate electrode 10.

The above mentioned structure is substantially the same as a fundamental structure of a CCD. In this connection, it should be understood that a pair of transfer electrodes 6 and 7 constitute a final stage of an electric charge transfer section of the CCD device, and the other transfer electrodes of the electric charge transfer section are omitted for simplification of the drawing.

The shown circuit also includes a reference signal generation circuit 11 for generating a reference clock $\phi_1$, which is supplied to a transfer clock generating circuit 12. This transfer clock generating circuit 12 generates a transfer clock $\phi_H$ and a reset clock $\phi_R$. The transfer clock $\phi_H$ is supplied to the transfer electrodes 6 and 7 and the other transfer electrodes (not shown) of the charge transfer section, and the reset clock $\phi_R$ is applied to the reset gate electrode 10. The reference clock $\phi_1$ is also supplied to a counter 14, where the reference clock $\phi_1$ is frequency-divided. The frequency-divided signal outputted from the counter 14 are supplied through data signal lines 28A to a D/A converter (digital-to-analog converter) 13, and also through data signal lines 28B to a data latch 15. Signals transferred through the data signal lines 28A and 28B are binary signals in synchronism with the reference signal $\phi_1$.

An output of the D/A converter 13 is connected to the final transfer gate electrode 8. The output gate electrode 9 is connected to a voltage supply 20 for applying an appropriate voltage that does not become a hindrance in the charge transfer. The floating diffusion region 22 is connected to an inverted input of a voltage comparator 17, which has a non-inverted input connected to receive a reference voltage Vref from reference voltage supply 19, so that a potential Vf of the floating diffusion region 22 is compared with the reference voltage Vref. When the potential Vf of the floating diffusion region 22 is lower than the reference voltage Vref, the voltage comparator 17 generates a data hold signal to the data latch 15, so that the data latch 15 holds the signals on the data signals 28B and outputs the held signals through output signal lines 16. The reference voltage Vref is set to be slightly lower than the potential of the reset drain voltage 18, so that no malfunction occurs due to external noises.

In this embodiment, a maximum resolution of the A/D conversion is the bit number of the D/A converter 13.

Now, operation will be described with reference to FIGS. 5 and 6.

A signal charge Q transferred from the charge transfer section is transferred to a region under the transfer electrode 7, by bring the transfer electrodes 6 and 7 to a high potential. After the final transfer gate electrode 8 is brought to a high potential, if the transfer electrode 7 is brought to a low potential, the signal charge Q is transferred to a region under the final transfer gate electrode 8 (timing $T_1$ in FIG. 5).

By gradually lowering the voltage applied to the final transfer gate electrode 8, the signal charge Q transferred under the final transfer gate electrode 8 flows through a region under the output gate electrode 9 into the floating diffusion region 22 (timings $T_2$ to $T_3$ in FIG. 5). In the example shown in FIG. 5, the voltage applied to the final transfer gate electrode 8 is lowered step by step).

At this time, the potential under the final transfer gate electrode 8 lowers in proportion to the amount of electric charge existing under the final transfer gate electrode 8. Therefore, when the amount of electric charge is large, even if the gate voltage is high, the signal charge flows through the region under the output gate electrode 9 into the floating diffusion region 22. To the contrary, when the amount of electric charge is small, the signal charge does not flow into the floating diffusion region 22 until the gate voltage becomes low.

Because of the signal charge having flowed into the floating diffusion region 22, the potential of the floating diffusion region 22 is caused to be displaced from the reset potential (timing $T_3$).

This displacement of the potential in the floating diffusion region 22 is compared with the reference voltage Vref, and when the output of the comparator 19 rises up, the digital data on the data signal lines 28B are latched in the data latch 15. At this moment, the digital data latched in the data latch 15 is the same as that is received by the D/A converter 13 which generates the voltage supplied to the final transfer gate electrode 8. Namely, the latched data corresponds to the potential of the final transfer gate electrode It is known in the CCD that the relation between the gate voltage and the stored electric charge amount is determined by the amount of signal charge existing under the gate electrode and the voltage applied to the transfer gate electrode. This relation is positive, and therefore, the latched data corresponding to the final transfer gate electrode voltage is indicative of the signal electric charge itself. Accordingly, the signal electric charge amount can be obtained in the form of a digital signal from the signal output lines 16.

For example, in the case of realizing a two-bit A/T conversion in accordance with the first embodiment disclosed above, the D/A converter 3, the counter 14, the latch 15, the data signal lines 28A and 28B, the signal output lines 16 are constituted of two bits, respectively.

A gate length L of the final transfer gate electrode 8 is made to be the same as that of the transfer gate electrode 7, and a channel width W is made in a range of three fourths (¾) of the width of the transfer gate 7 to the width of the transfer gate 7. In addition, the concentration of the N-type silicon substrate 1 is $1 \times 10^{14}/cm^3$, and the concentration of the P-well 2 is $1 \times 10^{16}/cm^3$. The concentration of the N-well 3 is $1 \times 10^{17}/cm^3$. The size of the floating diffusion region 22 is independent of the resolution, but the smaller the size of the floating diffusion region 22 is, a detection error becomes small.

Furthermore, it is configured such that, when both the MSB bit and the LSB bit of the data signal lines 28A are at a high level "1", respectively, the output voltage of the D/A converter 13 becomes the same as a high level voltage of the transfer clock $\phi_H$ (ordinarily, 5 V). Similarly, when both the MSB bit and the LSB bit of the data signal lines 28A are at a low level "0", respectively, the output voltage of the D/A converter 13 becomes the same as a low level voltage of the transfer clock $\phi_H$ (ordinarily, 0 V). When the MSB bit and the LSB bit of the data signal lines 28A are at the high level "1" and at the low level "0", respectively, the output voltage of the D/A converter 13 becomes two thirds (⅔) of 5 V (namely, 3.33 V). When the MSB bit and the LSB bit of the data signal lines 28A are at the low level "0" and at the high level "1", respectively, the output voltage of the D/A converter 13 becomes one third (⅓) of 5 V (namely, 1.66 V).

In addition, the voltage applied to the output gate electrode 9 is set in the range of 0 V to 1.66 V.

The amount of electric charge stored in the final transfer gate electrode 8 is in proportion to the channel width of the final transfer gate electrode 8. Since the channel width of the final transfer gate electrode 8 is smaller than that of the transfer electrode 7, the amount of electric charge able to be stored in the final transfer gate electrode 8 is smaller than the amount of electric charge able to be stored in the transfer gate electrode 7. Therefore, if the amount of electric charge transferred into the final transfer gate electrode 8 from the transfer gate electrode 7 is in a range between a maximum transfer electric charge amount of the transfer gate electrode 7 and three fourths (¾) of of the maximum transfer electric charge amount, the electric charge flows into the floating diffusion region 22 at the same time the electric charge is transferred under the final transfer gate electrode 8.

In the case that the amount of transferred electric charge is in the range of a half (½) to three fourths (¾) of of the maximum transfer electric charge amount, when the electric charge is transferred under the final transfer gate electrode 8, since the voltage of the final transfer gate electrode 8 is 5 V, the electric charge transferred under the final transfer gate electrode 8 does not flow into the floating diffusion region 22. Thereafter, when the MSB bit and the LSB bit of the data signal lines 28A become the high level "1" and the low level "0", respectively, namely, when the voltage of the final transfer gate electrode 8 becomes 3.33 V, the amount of electric charge able to be stored under the final transfer gate electrode 8 becomes about two thirds (⅔) of the amount able to be stored when the voltage of the final transfer gate electrode 8 is 5 V. An electric charge which cannot be stored under the final transfer gate electrode 8, flows into into the floating diffusion region 22. Thus, the data on the data signal lines 28B is latched in the latch in response to the output of the comparator 17 (timing $T_3$).

Similarly, in the case that the amount of transferred electric charge is in the range of one fourth (¼) to a half (½) of the maximum transfer electric charge amount, when the electric charge is transferred under the final transfer gate electrode 8, since the voltage of the final transfer gate electrode 8 is 5 V, the electric charge transferred under the final transfer gate electrode 8 does not flow into the floating diffusion region 22. Thereafter, even if the MSB bit and the LSB bit of the data signal lines 28A have become the high level "1" and the low level "0", respectively, namely, even if the voltage of the final transfer gate electrode 8 has become 3.33 V, the electric charge does not flow into the floating diffusion region 22. However, when the MSB bit and the LSB bit of the data signal lines 28A become the low level "0" and the high level "1", respectively, namely, when the voltage of line final transfer gate electrode 8 becomes 1.66 V, the amount of electric charge able to be stored under the final transfer gate electrode 8 becomes about one third (⅓) of the amount able to be stored when the voltage of the final transfer gate electrode 8 is 5 V. Accordingly, an electric charge which cannot be stored under the final transfer gate electrode 8, flows into into the floating diffusion region 22. Thus, the data on the data signal lines 28B is latched in the latch in response to the output of the comparator 17 (timing $T_6$).

Furthermore, in the case that the amount of transferred electric charge is not greater than one fourth (¼) of the maximum transfer electric charge amount, when the electric charge is transferred under the final transfer gate electrode 8, since the voltage of the final transfer gate electrode 8 is 5 V, the electric charge does not flow into the floating diffusion region 22. Thereafter, even if the MSB bit and the LSB bit of the data signal lines 28A have become the high level "1" and the low level "0", respectively, namely, even if the voltage of the final transfer gate electrode 8 has become 3.33 V, the electric charge does not flow into the floating diffusion region 22. Further, even if the MSB bit and the LSB bit of the data signal lines 28A have become the low level "0" and the high level "1", respectively, namely, even if the voltage of the final transfer gate electrode 8 has become 1.66 V, the electric charge does not flow into the floating diffusion region 22. However, when both of the MSB bit and the LSB bit of the data signal lines 28A become the low level "0", all of the amount of electric charge stored under the final transfer gate electrode 8 flows into into the floating diffusion region 22. Thus, the data on the data signal lines 28B is latched in the latch in response to the output of the comparator 17.

Incidentally, in the case of no electric charge, since the counting operation of the counter 14 is stopped, a digital output can be obtained similarly.

It can be generally said that an analog circuit is more complicated in construction than a digital circuit. Since the shown embodiment has only one voltage comparator, the circuit construction can be very simpler than the conventional example shown in FIG. 2.

Figure 7:
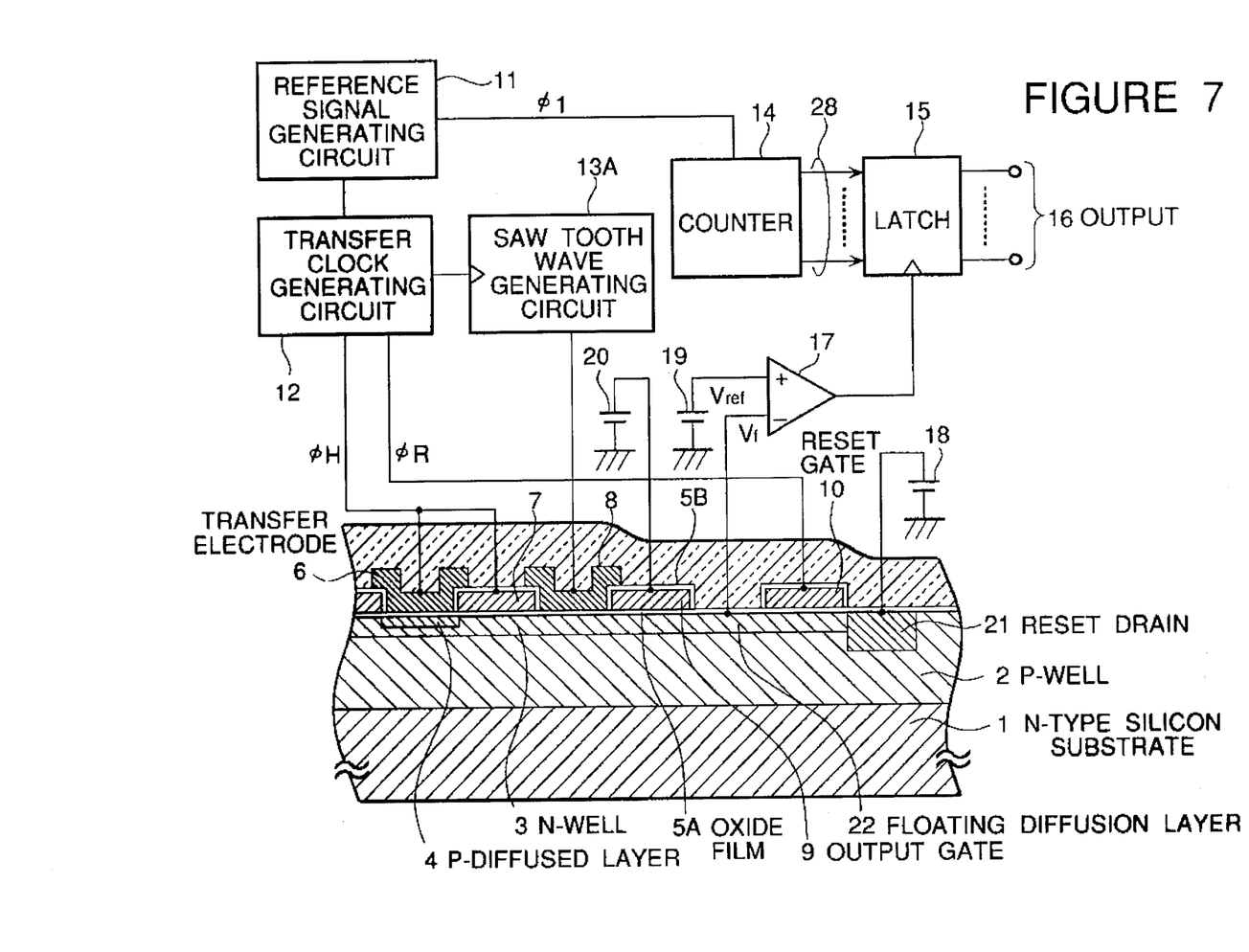
FIG. 7 is a block diagram illustrating a second embodiment of an A/D converting circuitry in accordance with the present invention.
Figure 8A:
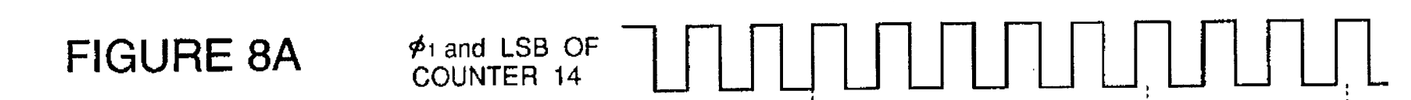
FIG. 8 is a timing chart illustrating an operation of the second embodiment shown in FIG. 7.
Figure 8B:
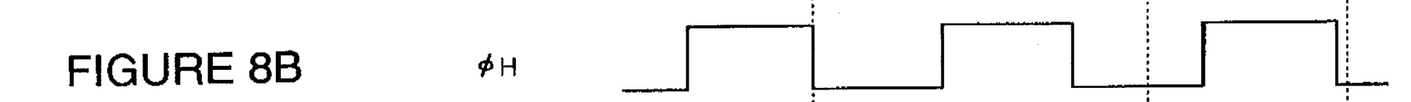
Figure 8C:
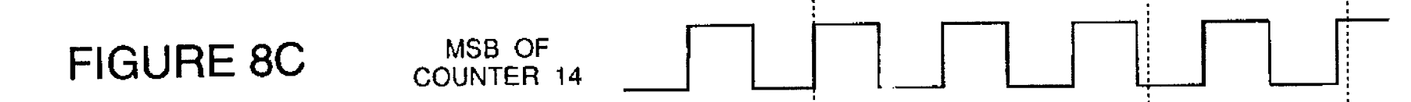
Figure 8D:
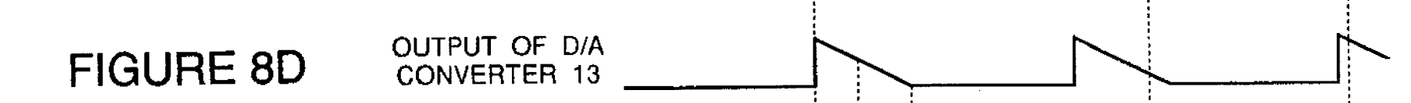
Figure 8E:
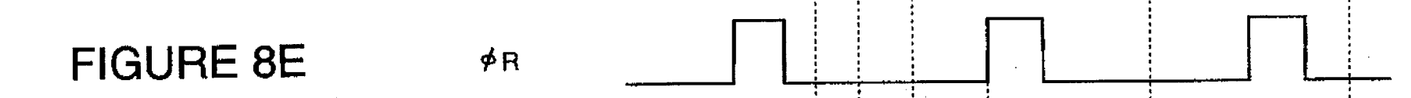
Figure 8F:
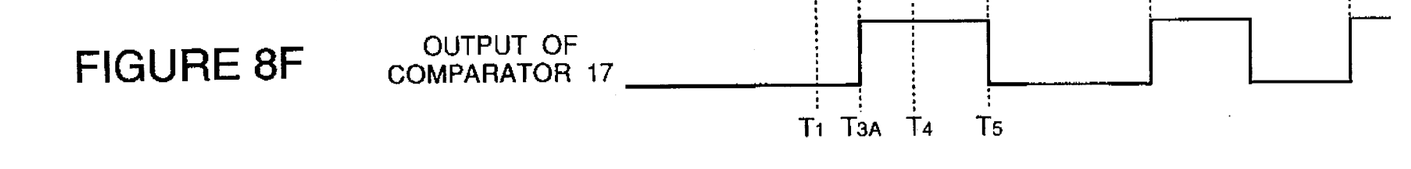

Referring to FIG. 7, there is shown a block diagram illustrating a second embodiment of an A/D converting circuitry in accordance with the present invention. FIG. 8 is a timing chart illustrating an operation of the second embodiment shown in FIG. 7. In FIG. 7, elements similar to those shown in FIG. 4 are given the same Reference Numerals, and explanation thereof will be omitted for simplification of the description.

In the first embodiment, a stepped wave voltage is generated by the D/A converter 13 and applied to the final transfer gate electrode 8. However, in this second embodiment, an output of a saw tooth wave generating circuit 13A, which can be composed of a monostable multivibrator or an integrating circuit, is applied to the final transfer gate electrode 8. Generation of a saw tooth wave is triggered by a trigger pulse generated by the transfer clock generating circuit 12, in synchronism with the reference signal $\phi_1$ generated by the reference signal generating circuit 11. The signal data latched in the date latch 15 is representative of a value obtained by subtracting from the pulse width ($T_4$–$T_1$ in FIG. 8) a time period ($T_{3A}$–$T_1$ in FIG. 8) starting from the moment $T_1$ the saw tooth wave is generated in response to the trigger pulse to the moment $T_{3A}$ the latch signal is generated by the comparator 17 so that the data on the signal lines 28 are latched in the latch 15.

Figure 9:
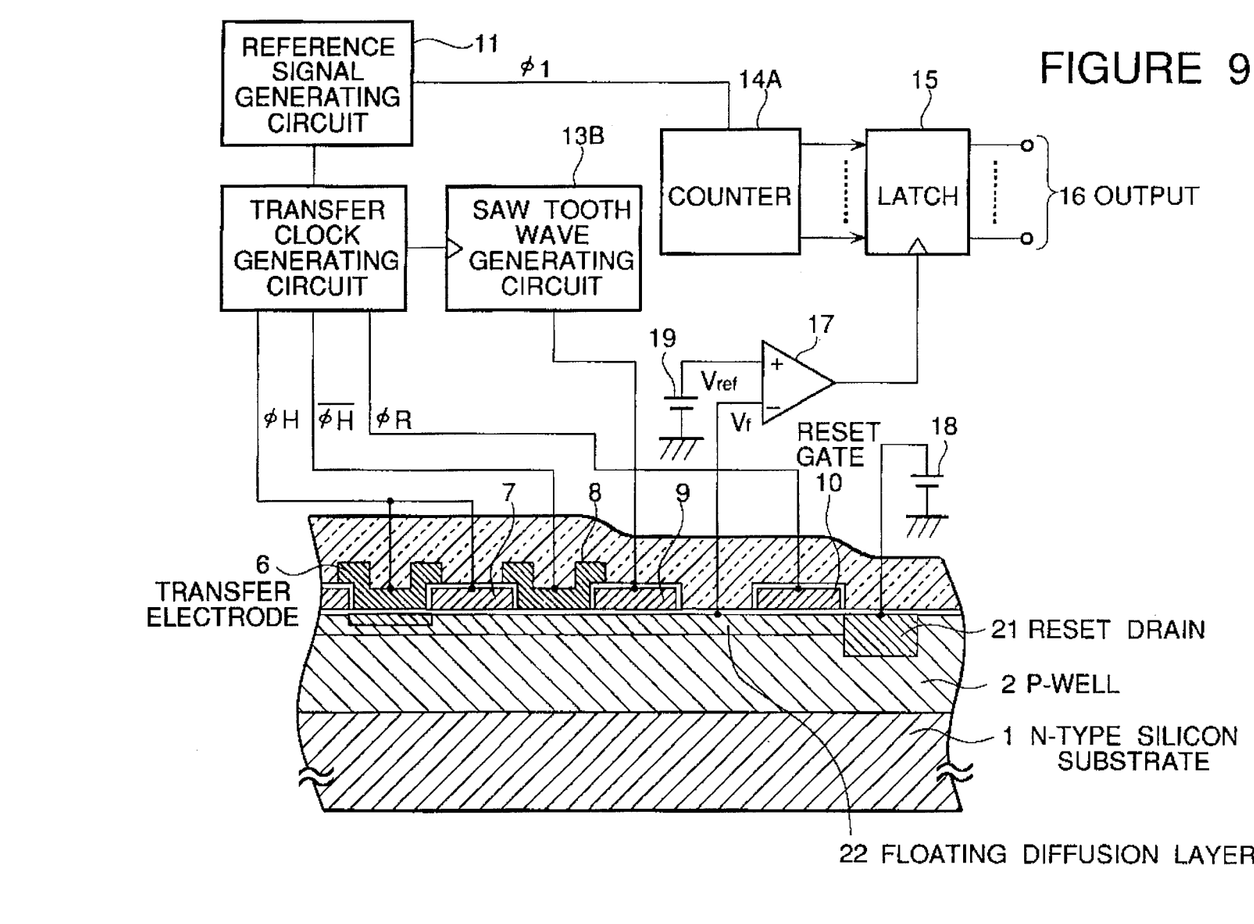
FIG. 9 is a block diagram illustrating a third embodiment of an A/D converting circuitry in accordance with the present invention.

Referring to FIG. 9, there is shown a block diagram illustrating a third embodiment of an A/D converting circuitry in accordance with the present invention. In FIG. 9, elements similar to those shown in FIG. 7 are given the same Reference Numerals, and explanation thereof will be omitted for simplification of the description.

The third embodiment is different from the second embodiment only in that the saw tooth wave generating circuit 13A is replaced by a saw tooth wave generating circuit 13B for generating a saw tooth wave gradually elevating its voltage, which is supplied to the output gate electrode 9, not to the final transfer gate electrode 8, and the final transfer gate electrode 8 is applied with a signal complementary to the transfer clock $\phi_H$.

With this arrangement, when the electric charge transferred from the transfer electrode 7 is retained under the final transfer gate electrode 8, if the voltage of the output gate electrode 9 is gradually elevated, the more the signal electric charge amount is, the stored electric charge overflows into the floating diffusion region 22 at a lower voltage. To the contrary, the less the signal electric charge amount is, it is necessary to apply the output gate with a higher voltage in order to cause the electric charge to overflow into the floating diffusion region 22. The moment the electric charge has overflowed, it is detected by the comparator 17, similarly to the first embodiment, so that die signal charge amount can be detected as a digital signal.

Figure 10:
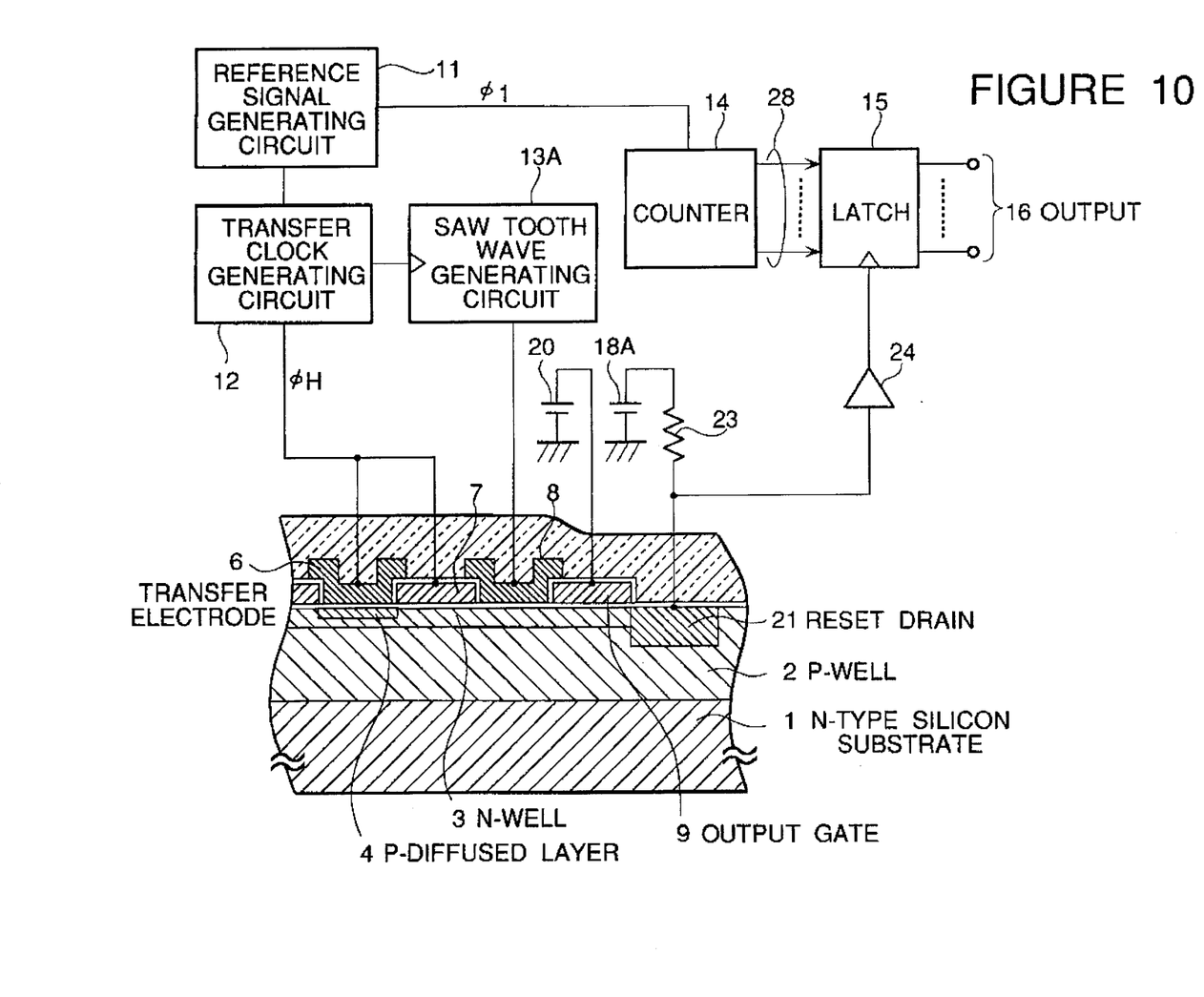
FIG. 10 is a block diagram illustrating a fourth embodiment of an A/D convening circuitry in accordance with the present invention.

Referring to FIG. 10, there is shown a block diagram illustrating a fourth embodiment of an A/D converting circuitry in accordance with the present invention. In FIG. 10, elements similar to those shown in FIG. 7 are given the same Reference Numerals, and explanation thereof will be omitted for simplification of the description.

The fourth embodiment is different from the second embodiment, in that a current detection is adopted for the purpose of detecting the signal electric charge. For the current detection, the reset drain 21 is connected to a voltage 18A through a resistor 23 which is on the order of 1 MΩ, and also connected to art input of a voltage amplifier 24, which in turn has an output connected to a latch control input of the latch 15.

When an electric charge having overflowed from the region under the output gate electrode 9 reaches the reset drain 21, the potential of the reset drain 21 changes similarly to the case of the floating diffusion region 22. When an output of the voltage amplifier 24 for amplifying the potential of the reset drain 21 reaches a threshold voltage of the latch 15, the signal on the data signal lines 28 is latched in the latch 15.

It would be a matter of course to persons skilled in the art that this current detection can be applied to the first embodiment.

Figure 11:
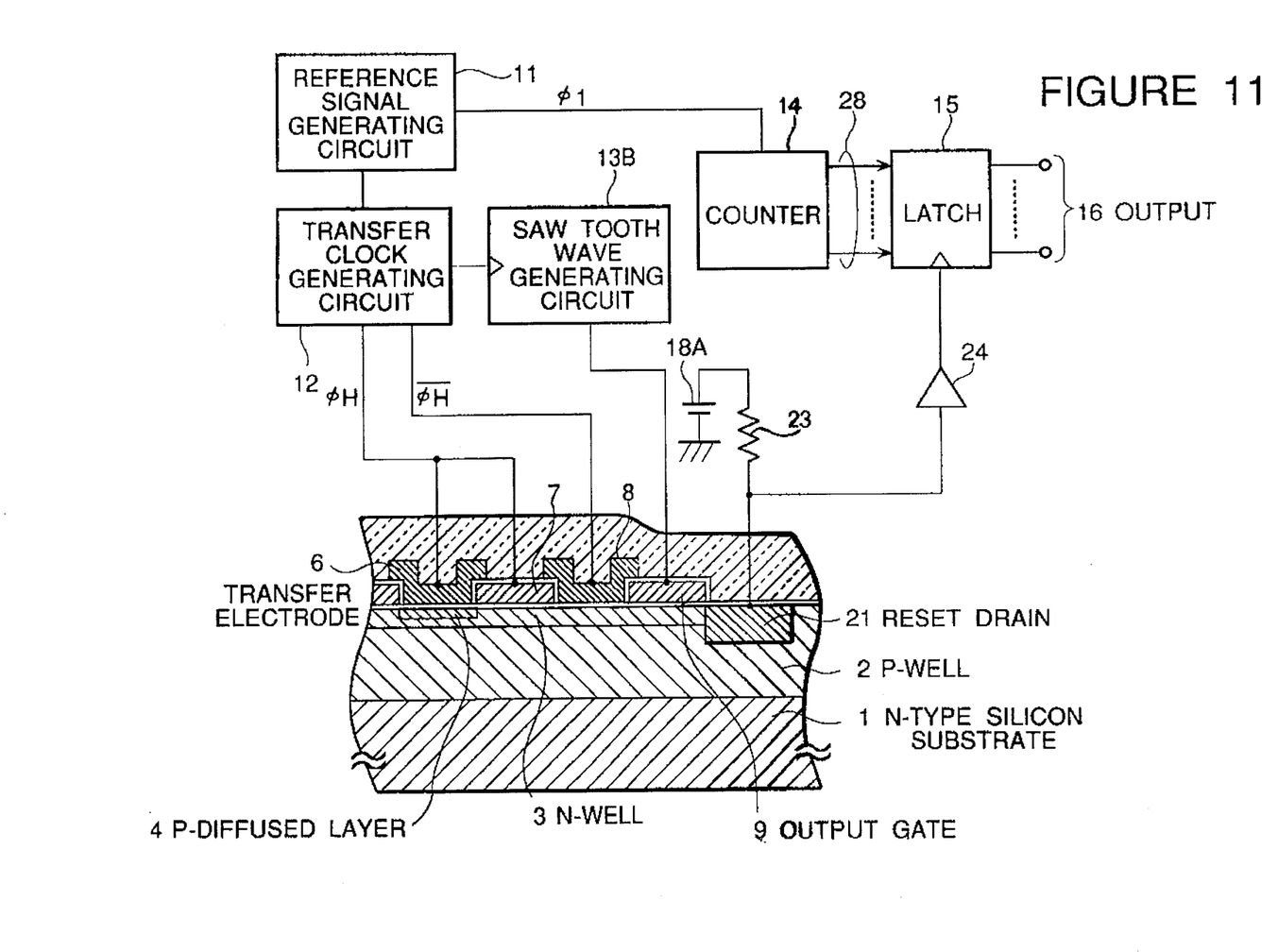
FIG. 11 is a block diagram illustrating a fifth embodiment of an A/D converting circuitry in accordance with the present invention.

Referring to FIG. 11, there is shown a block diagram illustrating a fifth embodiment of an A/D converting circuitry in accordance with the present invention. In FIG. 11, elements similar to those shown in FIGS. 9 and 10 are given the same Reference Numerals, and explanation thereof will be omitted for simplification of the description.

This fifth embodiment is such that the current detection of the fourth embodiment is applied to the third embodiment, in place of the voltage detection. Therefore, since operation will be apparent further explanation will be omitted.

As will be seen from the above, in the present invention, a maximum resolution of the A/D conversion is the digit number of the counter.

As mentioned above, the first embodiment is such that the voltage applied to the final transfer gate electrode is generated by the D/A converter. However, it is sufficient if it is possible to obtain an equivalent signal in synchronism with the start of the conversion operation as shown in the second to fifth embodiments. The voltage generating means is in no way limited to the D/A converter.

In addition, the above mentioned embodiments have adopted the voltage detection method-or the current detection method. However, the essence of the present invention is not limited to these detection methods. For example, it is possible to adopt a floating gate type electric charge detector.

Furthermore, since the D/A converter and the voltage comparator can be fabricated together with the CCD in the same process, these elements can be integrated on the same chip.

As will be apparent from the above description, since it is possible to reduce the number of analog circuits according to the present invention, it is possible to manufacture a circuit which can give a digital signal corresponding to a signal electric charge, and which is remarkably simpler than the conventional circuit.

In addition, if the present invention is applied to the CCD image sensor, the output of the CCD image sensor which was an analog signal in the prior art, can be obtained in the form of a digital signal, and therefore, it is possible to easily design a peripheral circuit.

The invention has thus been shown and described with reference to the specific embodiments. However, it should be noted that the present invention is in no way limited to the details of the illustrated structures but changes and modifications may be made within the scope of the appended claims.

I claim:

1. A signal processing device comprising:

a charge transfer device including a charge transfer section composed of a plurality of transfer electrodes formed through a gate insulating film on a surface of a semiconductor substrate and arranged in file form of a column, a final transfer gate located adjacent to an output end of said charge transfer section, an output gate located adjacent to said final transfer gate, and an electric charge detection means located adjacent to said output gate; and a driving circuit including a reference signal generating circuit for generating a reference signal, a transfer clock generating circuit receiving said reference signal for generating a transfer clock to said charge transfer section, a digital counter of N bits receiving and counting said reference signal, a voltage generating means for generating a voltage starting to change only in a voltage decreasing direction in synchronism with the start of a counting operation of said counter, said voltage being applied to one of said final transfer gate and said output gate, and a latch for latching an output of said counter when an output of said electric charge detection means reaches a predetermined level, whereby said latch outputs a digital signal of N bits corresponding to a signal electric charge outputted from said charge transfer section.

2. A signal processing device claimed in claim 1 wherein said voltage generating means includes a D/A converter receiving the output of said counter for converting said output into an analog voltage signal, which is applied to said final transfer gate.

3. A signal processing device claimed in claim 1 wherein said voltage generating means includes a saw tooth wave generating circuit for generating a saw tooth wave in response to an output signal of said transfer dock generating circuit and in synchronism with said reference signal, said saw tooth wave being applied to said final transfer gate.

4. A signal processing device claimed in claim 1 wherein said transfer clock is also applied to said final transfer gate, and wherein said voltage generating means includes a saw tooth wave generating circuit for generating a saw tooth wave in response to an output signal of said transfer dock generating circuit and in synchronism with said reference signal, said saw tooth wave being applied to said output gate.

5. A signal processing device claimed in claim 1 wherein said electric charge detection means is of a voltage detection type, and further including a voltage comparator having an inverted input connected to receive an output signal of said electric charge detection means and a non-inverted input connected to a reference voltage, an output of said voltage comparator being applied to a latch control input of said latch.

6. A signal processing device claimed in claim 1 wherein said electric charge detection means is of a current detection type.

* * * * *